United States Patent
Xiong et al.

(10) Patent No.: US 8,470,707 B2
(45) Date of Patent: Jun. 25, 2013

(54) SILICIDE METHOD

(75) Inventors: Weize Xiong, Plano, TX (US); Deborah J. Riley, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/287,671

(22) Filed: Nov. 2, 2011

(65) Prior Publication Data
US 2012/0108027 A1 May 3, 2012

Related U.S. Application Data

(60) Provisional application No. 61/409,578, filed on Nov. 3, 2010.

(51) Int. Cl.
*H01L 21/4763* (2006.01)

(52) U.S. Cl.
USPC ............ 438/630; 257/E21.433; 257/E21.439; 257/E21.593; 257/E21.619; 257/E21.634; 438/303; 438/648; 438/651; 438/655; 438/664; 438/682; 438/721; 438/755

(58) Field of Classification Search
USPC ................... 257/E21.433, E21.439, E21.593, 257/E21.619, E21.634; 438/303, 630, 648, 438/651, 655, 664, 682, 721, 755
See application file for complete search history.

(56) References Cited

U.S. PATENT DOCUMENTS
2011/0237040 A1* 9/2011 Ng et al. ........................ 438/303

\* cited by examiner

*Primary Examiner* — Asok K Sarkar
(74) *Attorney, Agent, or Firm* — Jacqueline J. Garner; Wade J. Brady, III; Frederick J. Telecky, Jr.

(57) ABSTRACT

A process for forming an integrated circuit with reduced sidewall spacers to enable improved silicide formation between minimum spaced transistor gates. A process for forming an integrated circuit with reduced sidewall spacers by first forming sidewall spacer by etching a sidewall dielectric and stopping on an etch stop layer, implanting source and drain dopants self aligned to the sidewall spacers, followed by removing a portion of the sidewall dielectric and removing the etch stop layer self aligned to the reduced sidewall spacers prior to forming silicide.

13 Claims, 5 Drawing Sheets

SILICIDE METHOD

FIELD OF THE INVENTION

This invention relates to the field of integrated circuits. More particularly, this invention relates to silicide formation in integrated circuits

BACKGROUND OF THE INVENTION

As integrated circuit continue to scale, design rules get smaller and process margins are reduced. To keep deep source drain implants from causing short channel effects, sidewall spacers are used to provide sufficient distance between the transistor channel and the deep source drain to avoid punchthrough. However, as the space between transistors sharing the same active is scaled the space between the sidewall spacers on adjacent transistors may become too small to form high quality silicide. This may result in higher contact resistance when a contact falls on poorly formed silicide. In addition, the contact etch may etch away a portion of the sidewalls causing the contact to land on unsilicided active area resulting in an additional increase in contact resistance. Since contact resistance and active resistance is in series with the transistor, this additional series resistance may degrade transistor performance.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A process for forming an integrated circuit with reduced sidewall spacers to enable improved silicide formation between minimum spaced transistor gates. A process for forming an integrated circuit with reduced sidewall spacers by first forming sidewall spacer by etching a sidewall dielectric and stopping on an etch stop layer, implanting source and drain dopants self aligned to the sidewall spacers, followed by removing a portion of the sidewall dielectric and removing the etch stop layer self aligned to the reduced sidewall spacers prior to forming silicide.

DETAILED DESCRIPTION

Figure 1A:
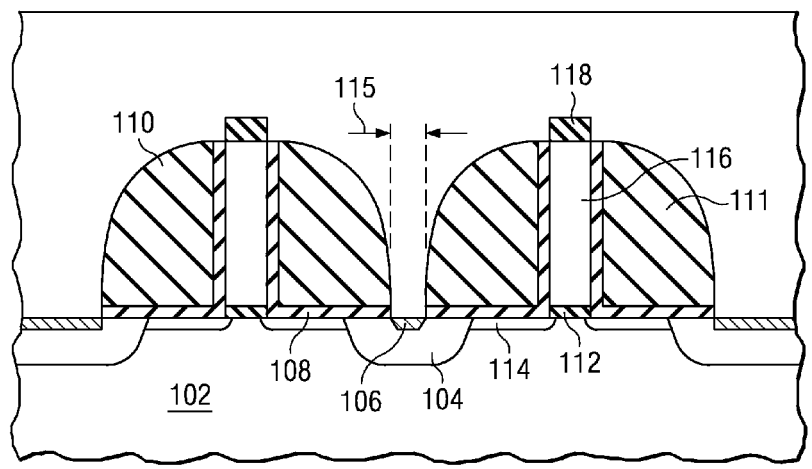
FIGS. 1A and 1B are cross-section of a stacked transistor pair.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1A illustrates two deep submicron, adjacent transistors in a deep submicron process flow. The transistors are formed on substrate, 102, with gate dielectric, 112, transistor gates, 116, etch stop liners, 108, sidewall spacers, 110 and 111, source and drain extensions, 114, and deep source and drains, 104. Silicide 106 is formed on the source and drains, 104, and silicide 118 is also formed on the gates, 116. As integrated circuit design rules continue to shrink transistor gates become closer together. The narrow space 115 between the adjacent sidewall spacers, 110 and 111, may result in poorly formed silicide that is thin and high sheet resistance. The increased series resistance may degrade performance of transistors such as NAND gates which are in series. For example when the lateral space 115 between the adjacent sidewall spacers 110 and 111 is less than about 30 nm, silicide formation for such silicides as nickel silicide, cobalt silicide, and platinum silicide may be significantly degraded resulting in nonuniform silicide formation with higher sheet resistance.

The term "adjacent sidewall spacers" refers to sidewall spacers that are formed between two transistor gates that are adjacent to each other in the same active geometry. For example, stacked transistors such as are formed for NAND gates have adjacent sidewall spacers formed between the stacked gates. One of the adjacent sidewalls is formed on one of the stacked gates and the other adjacent sidewall is formed on the adjacent stacked gate. As the space between two adjacent stacked gates is reduced the adjacent sidewall spacers get closer together. When the space between the two adjacent sidewall spacers goes below about 30 nm, silicide formation becomes non uniform.

The term "good silicide formation area" refers to an active geometry between adjacent sidewall spacers with a minimum width 115 greater than about 30 nm that is doped with a source and drain dopant. When a width of an active geometry is less than about 30 nm, silicide formation may be nonuniform with high sheet resistance.

Figure 1B:
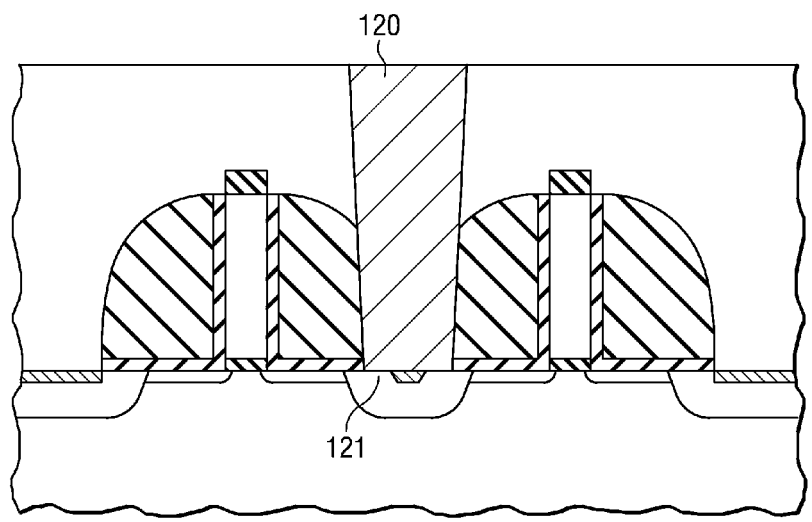

FIG. 1B illustrates an additional problem when the space 115 between adjacent sidewall spacers is too narrow. A contact formed between the two closely spaced adjacent transistors, may land on the poorly formed silicide resulting in high contact resistance. In addition, the contact etch may etch through the sidewall spacers and etch into the unsilicided substrate 121 damaging the substrate causing diode leakage. A portion of the contact may then fall on unsilicided active, 121, additionally increasing contact resistance and increasing diode leakage.

FIGS. 2A through 2H illustrate the major process steps for forming improved silicide and improved contact resistance between adjacent sidewall spacers according to an embodiment of the instant invention.

Figure 2A:
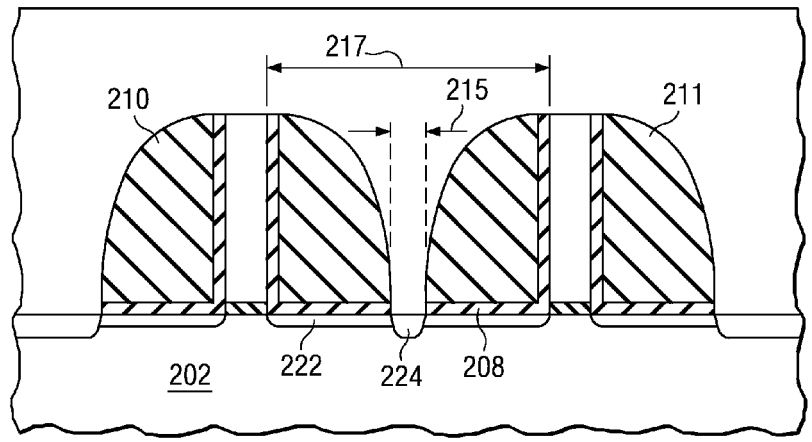
FIG. 2A through 2H are illustrations of steps in the fabrication of integrated circuits formed according to embodiments.

FIG. 2A shows two adjacent transistors formed on a substrate 202 that have been processed through the formation of transistor gates 216, etch stop liner 208, drain extension regions, 222, adjacent sidewall spacers, 210 and 211, and source and drain regions, 224. The transistors may be spaced with a minimum gate-to-gate design rule space apart 217 in a common active. The lateral thickness of the adjacent sidewall spacers, 210 and 211, is chosen to sufficiently space the source and drain implant from the gate and is a compromise between being sufficiently thick to minimize short channel effects and being sufficiently thin to minimize source and drain series resistance. In FIG. 2A, the etch stop liner, 208, is etched from region 224 into which source and drain dopants are implanted self aligned to the sidewall spacers 210 and 211. The thickness of sidewall spacers is dependent upon technology. The sidewall spacers may be formed of a dielectric material. Sidewall spacers are most commonly formed of silicon dioxide, silicon nitride, or silicon oxynitride or formed with a combination of layers silicon dioxide and silicon nitride. In an example embodiment, the gate spacing over active is about 85 nm in an SRAM array. Etch stop liner 208 is about 5 nm TEOS oxide and sidewall spacers 210 and 211 are approximately 25 nm silicon nitride. The lateral space 215 between the adjacent sidewall spacers in this embodiment is about 25 nm which may be insufficient for good silicide formation.

Figure 2B:
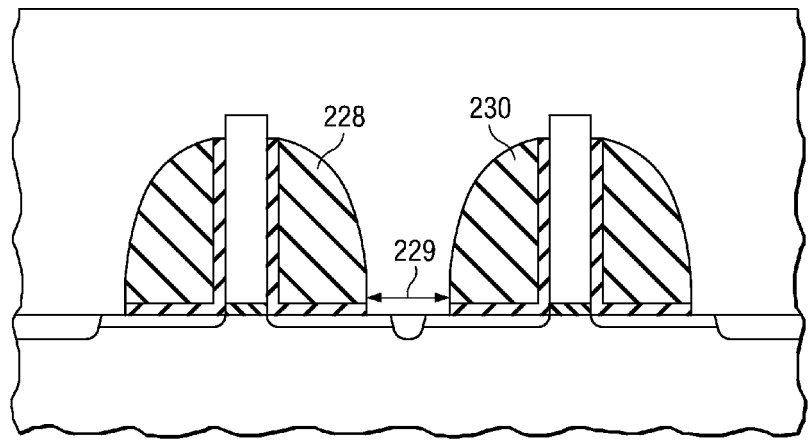

In FIG. 2B adjacent sidewall spacers, 210 and 211, and etch stop liner, 208, are etched (after source and drain implant) to remove a portion of the sidewall spacers to form reduced sidewalls, 228 and 230. This opens the space between the adjacent sidewall spacers enabling an improved silicide to be formed. The amount of reduction in the adjacent sidewall spacer lateral dimension is dependent upon the technology. The sidewall spacers may be reduced as much as manufacturing control permits without exposing the source and drain extensions, 222 after the source and drain dopants are annealed. Silicide formed on source and drain extensions may result in diode leakage and increased off current if the silicide comes into contact with the depletion region in the extension area. In an embodiment which uses nickel silicide, the space between the sidewall spacers is increased from about 25 nm to greater than about 35 nm to ensure good silicide formation. In this example embodiment sidewall spacers 210 and 211 may be 30 nm wide. Between about 3 nm and 10 nm may be etched from each sidewall spacer to form reduced sidewall spacers 228 and 230 and to form good silicide formation area, 229. Removing more than about 10 nm may result in the source and drain extensions 222 becoming exposed to silicide formation. The amount of sidewall spacer that may be removed without exposing the drain extensions 222 to silicide formation is technology dependent. More sidewall spacer material may be removed in technologies that drive the source and drain dopants a greater lateral distance. In a preferred embodiment, 5 nm may be laterally removed from each adjacent sidewall spacer, 210 and 211, to form reduced sidewall spacers, 228 and 230. The lateral space 229 between the sidewall spacers 210 and 211 is increased from about 25 nm 215 to about 35 nm forming a good silicide formation area 229 between reduced sidewall spacers 228 and 230.

Figure 2C:
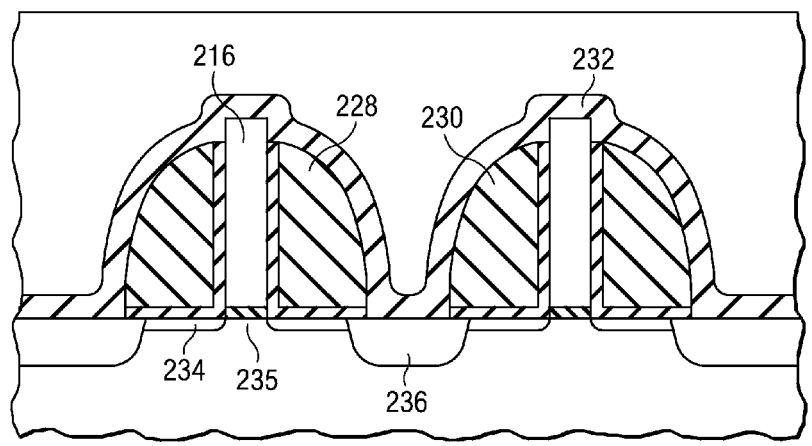

In FIG. 2C an optional stress memorization technique (SMT) film, 232, is deposited and the source and drains, 236, are annealed During the anneal, the source and drain dopant, 224, diffuses deeper and also diffuses laterally 236 under the edges of the reduced sidewalls, 228 and 230. The source and drain diffusion 236 underlies the good silicide formation area 229 after source and drain anneal. The drain extensions, 234, may also diffuse under the edges of the gates, 216 to connect the transistor channel 235 to the deep source and drain diffusions 236. In an example embodiment, about 12 nm of tensile silicon nitride is deposited prior to source and drain anneal to enhance electron mobility in the NMOS transistor channels. An advantage of the reduced sidewalls 228 and 230 is that the SMT film is closer to the gate 216. This improves stress memorization and thus improves transistor performance over conventional processes without reduced sidewalls.

Figure 2D:
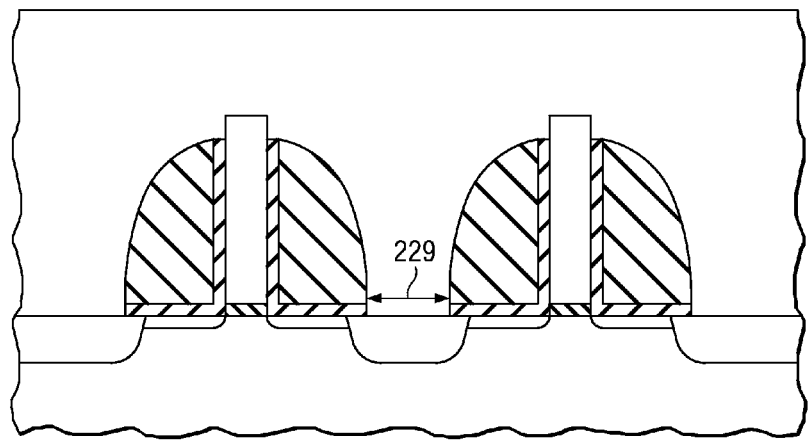

FIG. 2D shows the integrated circuit after SMT, 232, is removed.

Figure 2E:
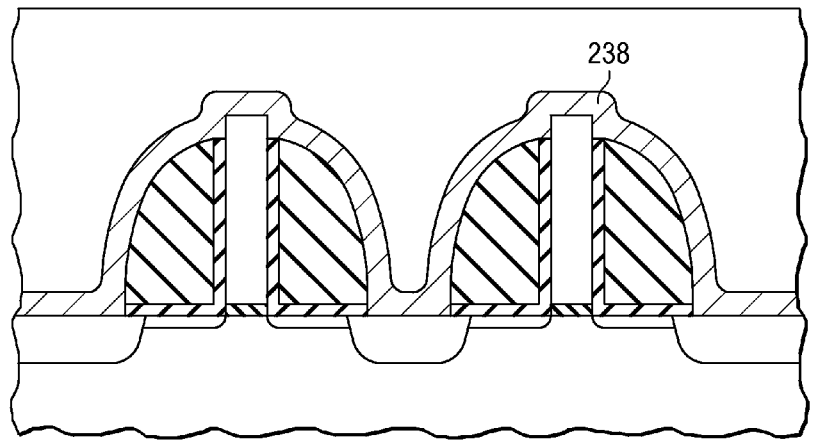

In FIG. 2E a silicide forming metal such as nickel, cobalt, or platinum, is deposited and reacted with exposed silicon to form silicide using well known procedures. In an example embodiment, approximately 10 nm of nickel is deposited and capped with approximately 10 nm of TiN. After reacting the nickel at about 30 sec at 300 C the unreacted TiN and unreacted nickel is stripped. An additional anneal at about 500 C reduces the sheet resistance of the nickel silicide to about 20 ohms per square.

Figure 2F:
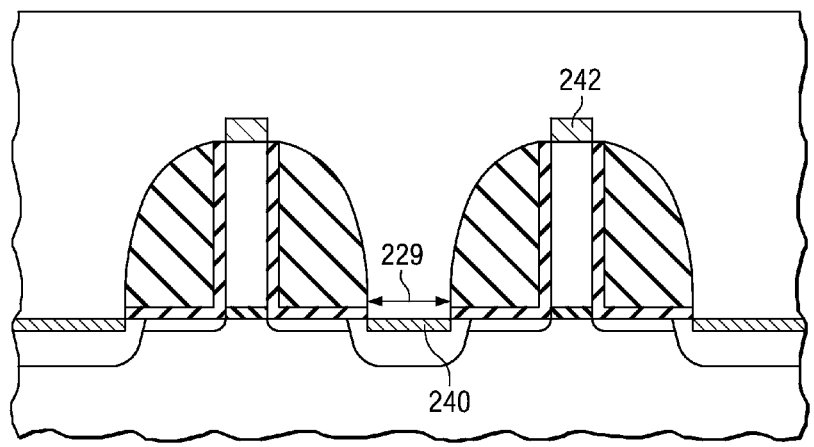

The silicide, 240, in the good silicide formation area 229 between the two adjacent reduced sidewalls 228 and 230 in FIG. 2F may be thicker and have lower sheet resistance than is possible with process flows not employing the reduced sidewall spacer and good silicide formation area embodiment. The good silicide formation area, 229, enabled by the reduced sidewalls, may result in an improved silicide with lower sheet resistance. Thus the performance of two transistors operating in series such as in NAND gates may be improved. In addition, the good silicide formation area, 229, forms an improved contact landing pad with lower contact resistance.

Figure 2G:
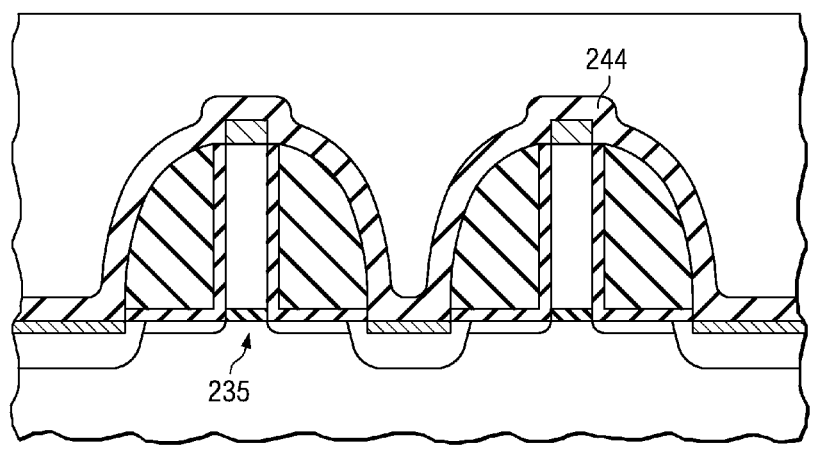

In FIG. 2G, stressor film, 244, which may be part of a dual stress liner (DSL) process is deposited. Stress liners are typically deposited to add tensile stress to the channel regions of NMOS transistors and compressive stress to the channel regions of PMOS transistors. The stress enhances carrier mobility thus improving transistor performance. Reduced sidewall spacers, 228 and 230, enable the stressor film 244 to be deposited closer to the gate 216 thus increasing the stress that is transferred to the transistor channel 235.

Figure 2H:
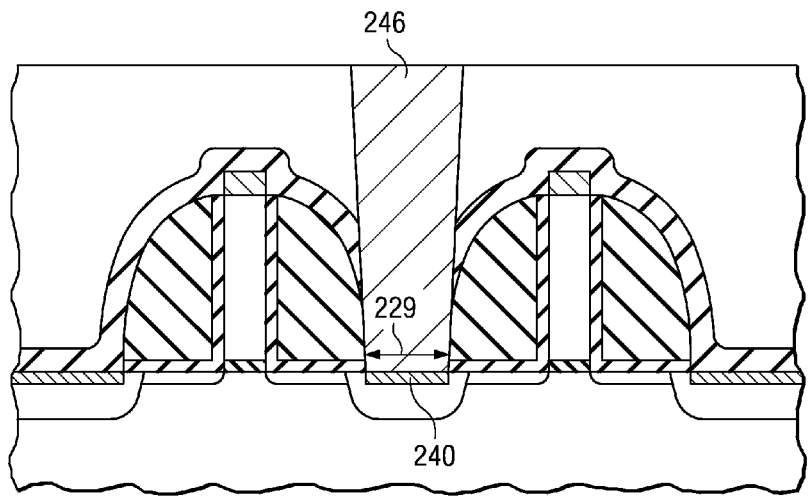

Contacts, 246, are formed in FIG. 2H. The larger and better formed silicide 240 in the good silicide formation area, 229, may provide lower contact resistance and improved circuit performance for.

As shown in FIG. 2B of the example embodiment, the surface of the silicon is exposed to the plasma etch during the formation of the reduced sidewall spacers 228 and 230. This may result in damage to the silicon substrate and may result in increased diode leakage if the damage is not completely removed during annealing. An embodiment method which may reduce substrate damage is illustrated in FIGS. 3A and 3B.

Figure 3A:
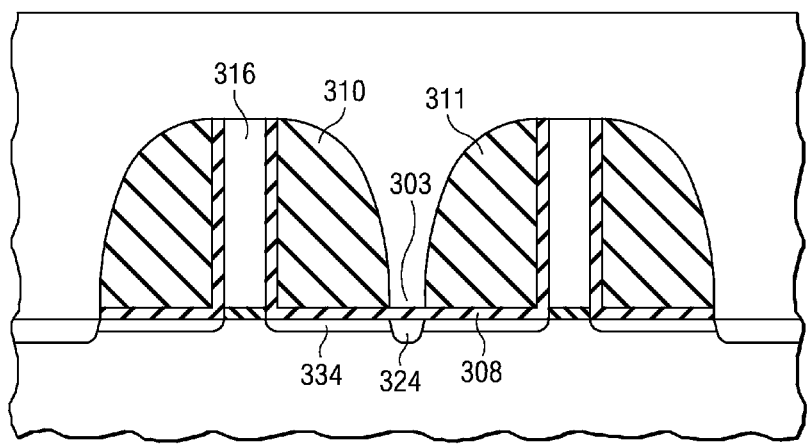
FIGS. 3A and FIG. 3B are illustrations of steps in the fabrication of integrated circuits formed according to embodiments.

FIG. 3A shows two adjacent transistors formed on a substrate 302 that have been processed through the formation of transistor gates 316, etch stop layer 308, drain extension regions, 334, adjacent sidewall spacers, 310 and 311, and source and drain implanted regions, 324. The lateral thickness of sidewall spacers is a compromise between being sufficiently thick to minimize short channel effects and being sufficiently thin to minimize series resistance. In FIG. 3A, the etch stop liner, 308, is left in place over the silicon substrate area 303 between the adjacent sidewall spacers, 310 and 311. The source and drain dopants 324 are implanted through the etch stop layer 308 self aligned to the sidewall spacers 310 and 311.

Figure 3B:
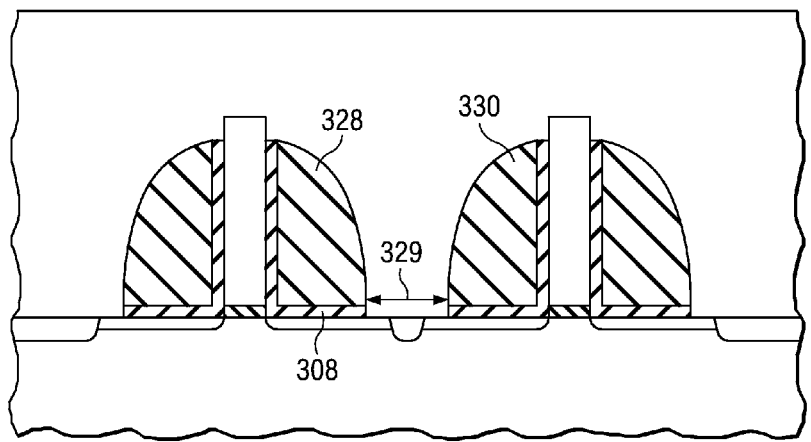

In FIG. 3B adjacent sidewall spacers, 310 and 311, are first etched to reduce the lateral dimension enlarging the lateral space to form a good silicide formation area 329. An etch with high selectivity to the liner 308 may be used to remove a portion of the adjacent sidewall spacers 310 and 311. The etch stop liner prevents damage to the underlying substrate 302 during the etching of the adjacent sidewall spacers, 310 and 311 to form adjacent reduced sidewall spacers 328 and 330. For example, if the adjacent sidewall spacers, 310 and 311, are made of silicon nitride and the etch stop layer 308 is made of silicon dioxide, a plasma nitride etch with high selectivity to silicon dioxide may be used to form the adjacent reduced sidewall spacers 328 and 330. Alternatively, if the adjacent sidewall spacers, 310 and 311, are composed of silicon dioxide and the etch stop liner 308 is composed of silicon nitride, a plasma oxide etch with high selectivity to nitride may be used to form adjacent reduced sidewalls 328 and 330.

After the adjacent reduced sidewalls 328 and 330 are formed, the etch may be changed from a sidewall spacer etch with high selectivity to etch stop layer 308 to an etch stop layer etch with high selectivity to substrate 302 to remove the etch stop layer 308 between adjacent reduced sidewall spacers 328 and 330 and over good silicide formation area 329.

After the liner 308 is etched self aligned to the adjacent reduced spacers, 328 and 330, the wafers may be processed through SMT, source and drain anneal, DSL and PMD, and contact formation as described above in FIGS. 2C through 2H. This embodiment may significantly reduce plasma etch damage to the substrate and thereby reduce diode leakage that may be the result of substrate defects.

Figure 4A:
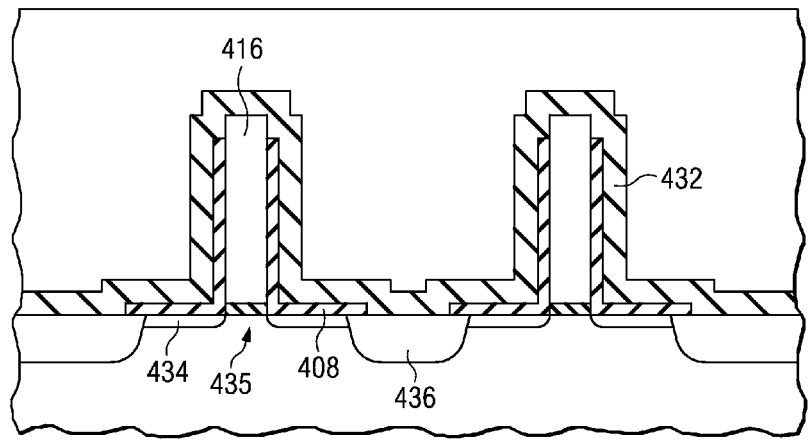
FIGS. 4A, 4B, and 4C are illustrations of steps in the fabrication of integrated circuits formed according to embodiments.
Figure 4B:
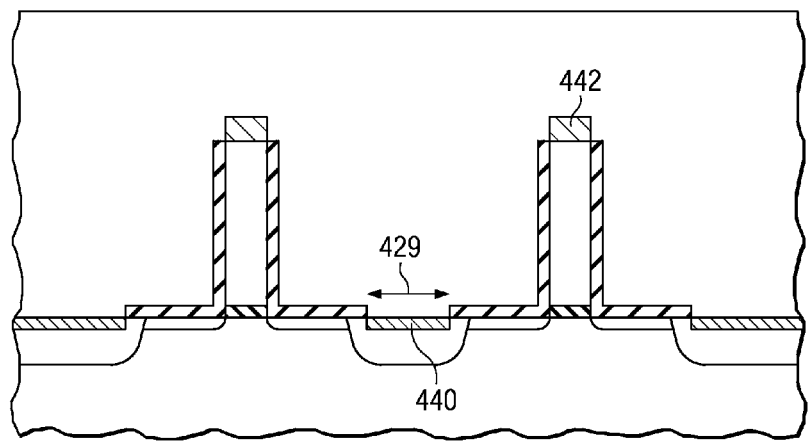
Figure 4C:
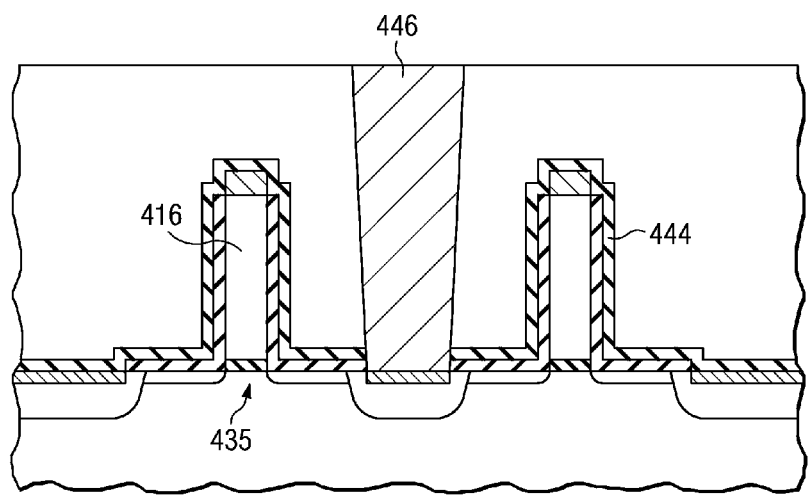

Another embodiment which may additionally enhance transistor performance by enabling the stress enhancement films such as SMT and DSL to be in closer proximity to the transistor channel regions and thereby to more efficiently transfer stress to the channel regions, is illustrated in FIGS. 4A, 4B and 4C which may be compared with FIGS. 2C, 2F, and 2H, respectively.

As shown in FIG. 4A after the reduced sidewalls are formed and the liner is etched, the reduced sidewalls may be additionally reduced or removed completely leaving the etch stop liner 408 in place. The sidewall spacers may be removed with a sidewall spacer etch that has high selectivity to substrate 402. Removing the reduced sidewall spacers enables the optional (SMT) film 432 to be deposited in closer proximity to the gate 416 and thereby enables the SMT film 432 to more efficiently transfer stress to the transistor channel region 435 during the source and drain anneal.

The etch stop liner 408 is left in place as shown in FIG. 4B to block silicide formation on the source and drain extensions 434 and also to block silicide formation on the vertical sides of the transistor gates 416. The opening in the etch stop liner 408 permits silicide formation on the good silicide formation area 429 and on top of the gates 442.

As shown in FIG. 4C, removal of the sidewall spacers while leaving the etch stop layer 408 intact, enables a stressor film 444 such as a DSL film to be deposited in closer proximity to the transistor gate 416 and thereby more efficiently transfer stress to the channel 435 of the transistor. The DSL film 444 may also form an etch stop layer for the etch used to form the opening for the contact 446.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising the steps:
   providing said integrated circuit that is partially formed with adjacent transistor gates and source and drain extensions self aligned to said adjacent transistor gates;
   depositing an etch stop layer over said adjacent transistor gates and over said source and drain extensions;
   depositing sidewall spacer dielectric material over said adjacent transistor gates and said etch stop layer;
   etching said sidewall spacer dielectric material to form adjacent sidewall spacers with a gap between bottoms of said adjacent sidewall spacers that is less than about 30 nm;
   implanting source and drain dopants self aligned to said sidewall spacers;
   removing a first portion of said two adjacent sidewall spacers with an etch to form adjacent reduced sidewall spacers where said gap is increased to greater than about 30 nm;
   annealing said integrated circuit and driving said source and drain dopants laterally under an edge of said reduced adjacent sidewall spacers to form source and drain regions;
   forming a silicide on said source and drain regions; and
   subsequently depositing a stressor layer.

2. The process of claim 1 further comprising the step of etching said etch stop layer prior to said step of removing and where said step of removing includes removing a first portion of said etch stop layer.

3. The process of claim 1 further comprising the step of etching said etch stop layer after said step of removing and prior to said step of forming a silicide.

4. The process of claim 1 where said step of removing further comprises removing between 3 nm and 10 nm of said sidewall spacers to form said reduced sidewall spacers.

5. The process of claim 4 where 5 nm is removed from said sidewall spacers.

6. The process of claim 1 further comprising the step of removing a second portion of said sidewall material after said step of forming reduced sidewalls and before said step of depositing said stressor layer.

7. A process of forming an integrated circuit, comprising the steps:
   providing said integrated circuit that is partially formed with adjacent transistor gates and source and drain extensions self aligned to said adjacent transistor gates;
   depositing an etch stop layer over said adjacent transistor gates and over said source and drain extensions;
   depositing sidewall spacer dielectric material over said adjacent transistor gates;
   etching said sidewall spacer dielectric material to form adjacent sidewall spacers with a gap between bottoms of said adjacent sidewall spacers that is less than about 30 nm;
   implanting source and drain dopants self aligned to said sidewall spacers;
   removing a first portion of said two adjacent sidewall spacers with an etch to form adjacent reduced sidewall spacers where said gap is increased to greater than about 30 nm;
   removing a second portion of said sidewall material after said step of forming reduced sidewalls;
   depositing a stress memorization technique (SMT) layer after said step of removing said second portion; and annealing said integrated circuit and driving said source and drain dopants laterally under an edge of said reduced adjacent sidewall spacers to form source and drain regions;

removing said SMT layer after said step of annealing; and forming a silicide on said source and drain regions.

8. A process of forming an integrated circuit, comprising the steps:

providing a substrate with said integrated circuit that is partially formed with adjacent transistor gates and source and drain extensions self aligned to said adjacent transistor gates;

depositing an etch stop layer over said adjacent transistor gates and over said source and drain extensions;

depositing sidewall spacer dielectric material over said adjacent transistor gates and the etch stop layer;

etching said sidewall spacer dielectric material with an etch that is selective to said etch stop layer to form adjacent sidewall spacers with a gap between bottoms of said adjacent sidewall spacers that is less than about 30 nm;

implanting source and drain dopants self aligned to said sidewall spacers;

removing a first portion of said two adjacent sidewall spacers with an etch that is selective to said etch stop layer to form adjacent reduced sidewall spacers where said gap is increased to greater than about 30 nm;

subsequently removing said etch stop layer with an etch that is selective to said substrate;

subsequently annealing said integrated circuit and driving said source and drain dopants laterally under an edge of said reduced adjacent sidewall spacers to form a good silicide formation area; and forming a silicide.

9. The process of claim 8 where said step of removing further comprises removing between 3 nm and 10 nm of said sidewall spacers to form said reduced sidewall spacers.

10. The process of claim 9 where 5 nm is removed from said sidewall spacers.

11. The process of claim 8 further comprising the steps:

removing a second portion of said sidewall material after said step of forming reduced sidewalls;

depositing a stressor layer after said step of removing a second portion and after said step of forming said silicide.

12. A process of forming an integrated circuit, comprising the steps:

providing a substrate with said integrated circuit that is partially formed with adjacent transistor gates and source and drain extensions self aligned to said adjacent transistor gates;

depositing an etch stop layer over said adjacent transistor gates and over said source and drain extensions;

depositing sidewall spacer dielectric material over said adjacent transistor gates;

etching said sidewall spacer dielectric material with an etch that is selective to said etch stop layer to form adjacent sidewall spacers with a gap between bottoms of said adjacent sidewall spacers that is less than about 30 nm;

implanting source and drain dopants self aligned to said sidewall spacers;

removing a first portion of said two adjacent sidewall spacers with an etch that is selective to said etch stop layer to form adjacent reduced sidewall spacers where said gap is increased to greater than about 30 nm;

removing said etch stop layer with an etch that is selective to said substrate;

removing a second portion of said sidewall material after said step of forming reduced sidewalls;

subsequently depositing a SMT layer after said step of removing said second portion;

subsequently annealing said integrated circuit and driving said source and drain dopants laterally under an edge of said reduced adjacent sidewall spacers to form a good silicide formation area;

subsequently removing said SMT layer; and forming a silicide.

13. The process of claim 12 further comprising the step of depositing a stressor layer after said step of forming said silicide.

* * * * *